(12) United States Patent
Kinnunen et al.

(10) Patent No.: US 11,228,234 B2
(45) Date of Patent: Jan. 18, 2022

(54) POWER CONVERTER ARRANGEMENT ATTENUATION ELEMENT FOR ELECTRICAL RINGING

(71) Applicant: ABB Schweiz AG, Baden (CH)

(72) Inventors: Henri Kinnunen, Veikkola (FI); Matti Laitinen, Helsinki (FI); Jukka-Pekka Kittilä, Helsinki (FI)

(73) Assignee: ABB Schweiz AG, Baden (CH)

( * ) Notice: Subject to any disclaimer, the term of this patent is extended or adjusted under 35 U.S.C. 154(b) by 154 days.

(21) Appl. No.: 16/661,412

(22) Filed: Oct. 23, 2019

(65) Prior Publication Data
US 2020/0136498 A1 Apr. 30, 2020

(51) Int. Cl.
H02M 1/14 (2006.01)
H02M 1/34 (2007.01)
H05K 7/00 (2006.01)

(52) U.S. Cl.
CPC ............... H02M 1/14 (2013.01); H02M 1/34 (2013.01); H05K 7/005 (2013.01); H02M 1/346 (2021.05)

(58) Field of Classification Search
CPC ......... H02M 3/33592; H02M 3/33576; H02M 1/08; H02M 3/33553
See application file for complete search history.

(56) References Cited

U.S. PATENT DOCUMENTS 6,377,479 B1 * 4/2002 Ayano ..................... H02M 1/12
363/40
6,982,378 B2 1/2006 Dickson
8,345,453 B2 * 1/2013 Itoh ......................... H02M 1/126
363/37

(Continued)

FOREIGN PATENT DOCUMENTS

EP 2192678 A1 6/2010
WO 2004073132 A1 8/2004

OTHER PUBLICATIONS

European Patent Office, Office Action issued in corresponding Application No. 18202552.8, dated Dec. 4, 2020, 10 pp.

(Continued)

Primary Examiner — Kyle J Moody
(74) Attorney, Agent, or Firm — Leydig, Voit & Mayer, Ltd.

(57) ABSTRACT

A power converter arrangement includes a semiconductor switch system with a controllable switch. A capacitor unit includes a capacitor having a capacitance value, the capacitor unit being operatively connected to the semiconductor switch system. A conductor arrangement includes a conductor adapted to conduct an electric current between the capacitor unit and the semiconductor switch system. The conductor has a resistance and an inductance. A resonant circuit is formed by the resistance, the inductance and the capacitance, and the power converter arrangement includes at least one attenuating element for attenuating an electrical ringing in the resonant circuit. The attenuating element is conductively isolated from the resonant circuit. The attenuating element includes ferromagnetic material, and the attenuating element is magnetically coupled to the conductor such that variations in the electric current intensity of the conductor induces eddy currents within the attenuating element.

13 Claims, 3 Drawing Sheets

(56) References Cited

U.S. PATENT DOCUMENTS

| | | | |
|---|---|---|---|
| 8,704,481 B2* | 4/2014 | Valdez | H02H 7/10 |
| | | | 318/801 |
| 9,271,432 B2* | 2/2016 | Yokozutsumi | H02M 7/48 |
| 9,595,881 B2* | 3/2017 | Ichihara | H02M 5/458 |

OTHER PUBLICATIONS

Callegaro et al., "Bus Bar Design for High-Power Inverters," IEEE Transactions on Power Electronics, vol. 33, No. 3, Mar. 2018, pp. 2354-2367.

European Patent Office, Extended Search Report issued in corresponding Application No. 18202552.8, dated Apr. 12, 2019, 11 pp.

Payne, A., "Shielding of Magnetic Fields by Eddy Currents," May 31, 2016, 25 pp., retrieved from the Internet: http://g3rbj.co.uk/wp-content/uploads/2016/05/Eddy-Currents-final-2.pdf.

Phan et al., "Electromagnetic interference shielding performance of epoxy composites filled with multiwalled carbon nanotubes/manganese zinc ferrite hybrid fillers," Journal of Magnesium and Magnetic Materials, vol. 401, 2016, pp. 472-478.

Urabe et al., "A Study of EMI Suppression Characteristics of Ferrite Cores," Electromagnetic Compatibility, 2006, EMC-Zurch, 17th International Zurich Symposium on Singapore, Feb. 2006, Piscataway, New Jersey, pp. 622-625.

"Ferrite Cores for EMI Suppression Plate Cores," Murata Manufacturing Co., Ltd., Data Sheet, FSSA Series, 4 pp., retrieved from the Internet: https://www.mouser.eom/ds/2/281/L0150S0505FSSA-472679.pdf.

\* cited by examiner

POWER CONVERTER ARRANGEMENT ATTENUATION ELEMENT FOR ELECTRICAL RINGING

FIELD OF THE INVENTION

The present invention relates to attenuation of electrical ringing in a power converter arrangement, and more particularly to a power converter arrangement comprising magnetically coupled attenuation element for attenuating electrical ringing in a resonant circuit of a power converter.

Opening and closing an electrical circuit causes electrical ringing in the electrical circuit due to reactive components, capacitances and inductances, of the electrical circuit. The capacitances and inductances form an LC circuit, also called a resonant circuit. Separate reactive components of an LC circuit are electrically connected to each other by conductors, which are generally mainly resistive. Due to physical properties of conductors, there is always present certain amount of parasitic capacitances between the conductors, the conductors also have certain amount of parasitic inductance in them. Therefore, any circuit having at least two parallel mounted conductors will always form an RLC-circuit, having resistive, inductive and capacitive properties. Electrical ringing, caused by the opening or closing of an electrical circuit or the like other sudden change in the current of the circuit, happens because energy stored to the reactive components (L/C) of the circuit starts to fluctuate between them until the resonant energy is dissipated into heat by the resistance. The higher the resistance value (in ohms) of the resistive component R of the RLC-circuit, the faster the electrical ringing is attenuated.

The electrical ringing phenomenon is particularly harmful in power converter arrangements, wherein the switching frequency of the power converter semiconductors is high, generally in the range of few hundred Hertz up to tens of kilo Hertz. Such power converter arrangement can comprise of inverters, frequency converters, DC-DC-choppers or the like, or alternatively the power converter arrangement can form a part of said devices. For example, one frequency converter (variable speed drive), inverter, DC-DC-chopper or the like can comprise one or more of said power converter arrangements.

The impulse for the resonance can occur in a power converter, when an operating current flowing in the RLC circuit between a DC-link and a semiconductor switch is suddenly reduced by turning off (non-conductive state) the semiconductor switch, which controls the operation current between the DC-link and the semiconductor switch. Thus, as the operating current in the resonant circuit is suddenly reduced, the magnetic energy stored to the inductance of the conductor is not maintained anymore by the current, and a voltage is formed (U=dI/dt) over the fictive terminals of the inductance. This created voltage, which is higher than the capacitor voltage in the resonant circuit, creates a current through the capacitor(s) to charge the capacitor(s) of the resonant circuit. As the current intensity change rate (dI/dt) of the inductor reduces due to reduction of stored magnetic energy of the inductor, the voltage over the fictive terminals of the inductor also reduces, which causes the capacitor, which now has higher voltage between it's terminals than the inductor due to said charging, to feed reactive current back to the inductor, and thus the cycle continues in a resonant manner. Since there is resistance in the circuit, the resonating reactive energy is eventually dissipated into heat and the circuit is brought to balance.

The higher the switching frequency, the less time there is for the ringing to be attenuated before the next switching operation. In certain cases, when the resistance of the RLC circuit, formed between the DC-link capacitors and the power converter switches, has a small value (e.g, less than 1 mOhm) and the switching frequency is relative high (e.g. above 1 kHz), the electrical ringing caused by one switching operation of the semiconductors of the power converter might not be attenuated until the next switching operation happens. If the electrical phase of the ringing (current or voltage) happens to be in an unfavorable position, the next switching operation of the semiconductors will amplify the ringing and increase the fluctuation energy, which can ultimately cause the power converter to malfunction, for example due to over voltage at the terminals of the semiconductor switch.

In the above case, as the power converters are generally designed to be as efficient as possible, increasing the resistance value of the RLC-circuit (which would increase attenuation) cannot be done without adding power dissipation for the converter and thus by reducing the efficiency of the power converter arrangement.

Another way to reduce the amount of electrical ringing in a resonance circuit is to reduce the inductance and/or capacitance values of the RLC-circuit. In a power converter, certain amount of capacitance is needed in the DC-link for operating the power converter. Therefore, the capacitance value of the RLC-circuit can hardly be reduced. The conductors (bus bar arrangement) connecting the semiconductors (switches) of the power converter to the plus and minus polarities of the DC-link capacitance are typically formed as flat plates, which are arranged as close to each other as possible, opposite polarities being separated of each other by an insulator plate, which is usually made of plastic. As the opposite polarity conductors are formed as plates on top of each other and are placed as close as possible to each other, this arrangement creates substantial amount of parasitic capacitance between the separate conductors. This parasitic capacitance closes the resonant circuit, thus forming a CLC or a CLRC-circuit comprising the DC-link capacitance, the inductance of the conductors, the resistance of the conductors and the parasitic capacitance between the separate conductors.

Arranging the conductors on top of each other as close as possible from each other reduces the amount of inductance that the such formed bus bar arrangement has. Even if the conductors are arranged such way, the inductance cannot be totally removed, and the ringing phenomenon continues to be a problem, especially as the trend continues to higher switching frequencies of the semiconductor switches.

Higher switching frequencies are preferred as the quality (in terms of THD) of generated power is improved, and this reduces the need for costly filtering (e.g. LCL-filter at output of the power converter arrangement). In addition, the newer semiconductor types (e.g. IGBTs and especially Silicon Carbide SiC) allow higher switching frequencies than before without adding significant amount of losses for the switching operation.

The high frequency electrical ringing causes electromagnetic interference, over-voltage and additional losses in the electrical circuits of a power converter arrangement.

BRIEF DESCRIPTION OF THE INVENTION

An object of the present invention is to provide an arrangement to alleviate the above disadvantages. The object of the invention is achieved by an arrangement, which is characterized by what is stated in the independent claim. The preferred embodiments of the invention are disclosed in the dependent claims.

The invention is based on the idea of arranging a ferromagnetic attenuation element in magnetic coupling with the inductance of a conductor of a RLC-circuit (resonance circuit) of a power converter arrangement. The ferromagnetic attenuating element is configured such that eddy currents are created within the ferromagnetic material, which eddy currents are induced by the changing magnetic flux created by the changing intensity of current passing through the inductance of the conductor of the RLC-circuit of the power converter arrangement.

In a preferred embodiment of the invention, the ferromagnetic attenuating element is configured to create substantially more eddy currents in the frequency range of the electrical ringing (resonance) of the RLC-circuit of the power converter arrangement than in the frequency range of the semiconductor switching of the power converter arrangement.

In another preferred embodiment the ferromagnetic attenuating element is mechanically and electrically arranged between the opposite voltage DC-link conductors of the power converter arrangement, the attenuating element being separated from the conductors by an insulator. Alternatively, the ferromagnetic attenuating element is arranged on opposite sides of the opposite voltage DC-link conductors of the power converter arrangement.

An advantage of the arrangement of the invention is that the ringing in the resonant circuit of the power converter arrangement can be attenuated, which reduces EMC emissions, reduces harmful over voltage spikes and reduces power losses in the resonant circuit.

BRIEF DESCRIPTION OF THE DRAWINGS

In the following the invention will be described in greater detail by means of preferred embodiments with reference to the attached drawings, in which.

DETAILED DESCRIPTION OF THE INVENTION

Figure 1:
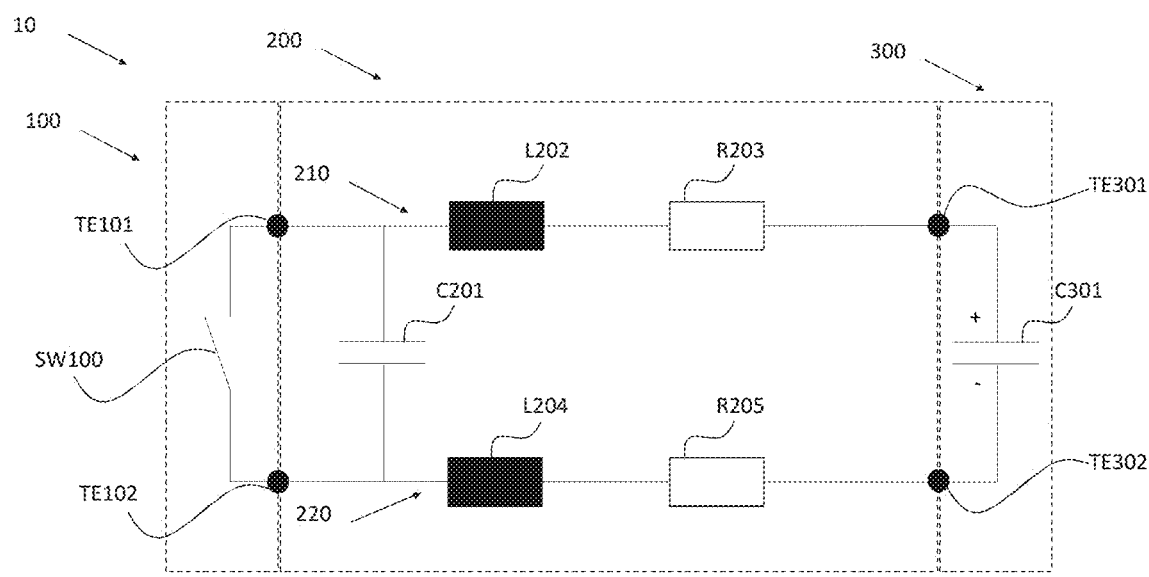
FIG. 1 shows a simplified electrical schematic of a power converter arrangement according to the invention.

FIG. 1 shows a simplified electrical equivalence circuit of a power converter arrangement 10 having a RLC-circuit. In general, FIG. 1 shows a circuit, wherein a semiconductor switch system 100 is electrically/operationally/conductively connected to a capacitor unit 300 via a conductor arrangement 200.

A semiconductor switch system 100 comprises a controllable semiconductor switch SW100, which is comprised of a known semiconductor switch unit such as IGBT, SiC or the like having a gate (not shown), a collector and an emitter. The collector and the emitter of the semiconductor switch SW100 are connected to semiconductor switch system 100 terminals TE101 and TE102 for electrically conductively connecting the semiconductor switch SW100 to an external electrical circuit, such as the conductor arrangement 200. The semiconductor switch system 100 also comprises a controller (not shown) and control circuit (not shown) configured to control the semiconductor switch SW100 via the gate pin of the semiconductor switch SW100.

In the FIG. 1, only one semiconductor switch SW100 is shown for simplicity, however, sometimes in a power converter application, two or more semiconductor switches are connected in series with each other and a load (e.g. a motor coil, grid phase impedance or the like) is electrically connected between the two or more semiconductor switches. Thus, the semiconductor switch system 100 can comprise of one or more of semiconductor switches SW100, in series or in parallel of each other.

In the simplest form, the semiconductor switch system 100 comprises of one semiconductor switch SW100, and the terminals TE101, TE102 of the semiconductor switch system 100 comprises the collector and the emitter terminals of the semiconductor switch SW100.

A capacitor unit 300 comprises a capacitor C301 having capacitance value, which can be, for example in a typical converter application, in the range of 0.1 mF-20 mF. The capacitor C301 opposite polarity poles (+ and −) are conductively connected to the capacitor unit 300 terminals TE301 and TE302. The capacitor unit 300 can comprise one or more capacitors C301 in series and in parallel in order to achieve desired capacitance value for the operation of the power converter arrangement 10. Such a capacitor unit 300 can be, for example, formed by a DC-link of a power converter arrangement 10.

A conductor arrangement 200 comprises electrical quantities (C201, L202, L204 and R203, R205) associated with the conductor arrangement 200. The conductor arrangement 200 comprises a conductor 210, which electrically conductively connects the semiconductor switch system 100 terminal TE101 and the capacitor unit 300 terminal TE301. The conductor arrangement 200 comprises a conductor 220, which electrically conductively connects the semiconductor switch system 100 terminal TE102 and the capacitor unit 300 terminal TE302. The conductor arrangement 200 comprises at least one conductor 210, 220 adapted to conduct an electric current between the capacitor unit 300 and the semiconductor switch system 100.

C201 represent parasitic capacitive nature between the conductors 210 and 220, the capacitance value of which can be, for example, in the range of nF to uF. In typical cases, the capacitance value of capacitor C201 between the conductors 210 and 220 is substantially smaller than the capacitance value of the capacitor C301.

L202 represents parasitic inductive nature of the conductor 210 and L204 represents parasitic inductive nature of the conductor 220. Inductance value of the inductance L202 or L204 can be, for example in a typical power converter application, in the range of nH to uH.

R203 represents resistive nature of the conductor 210 and R205 represents resistive nature of the conductor 220. The resistance value of R203 or R205 can be, for example in a typical power converter application, in the range of 0.1 mOhm to 10 mOhms. In a typical power converter arrangement, the conductors 210, 220 are made of sheet metal (e.g. copper or aluminium), or the like flat or plate type metal, wherein the opposite polarity conductors 210, 220 are placed on top of each other in order to reduce the circuit's inductance (L202, L204). The opposite polarity (+/−) conductors are separated, typically, by a sheet plastic insulator or the like. The direction of current in the opposite polarity connected conductors 210, 220 is also opposite to each other when placed in said arrangement.

From the FIG. 1 can be seen how a resonance (RLC) circuit is formed by the capacitance C301 of the capacitor unit 300, resistances R203, R205 of the conductors 210, 220, inductors L202, L204 of the conductors 210, 220 and capacitor C201 between the conductors 210, 220.

The RLC-circuit has a resonant frequency $f_{res}$, which depends on the electrical quantity values of the components forming the RLC-circuit. The resonant circuit has at least one resonant frequency $f_{res}$ or at least one resonant frequency range $f_{res\_range}$. Typically, in a power converter arrangement, the resonance frequency $f_{res}$ can be in the range of 10 kHz up to 1 MHz.

A switching operation of a semiconductor switch SW100 is controlled by a controller (not shown), the controller can control the semiconductor switch SW100 to a conductive state (ON) or to a non-conductive state (OFF) with a predetermined switching frequency $f_{SW}$, for example, according to a known modulation scheme (PWM or the like). The semiconductor switch system 100 has at least one switching frequency $f_{SW}$ or at least one switching frequency range $f_{SW\_range}$. The switching frequency $f_{SW}$ of a semiconductor switch SW100 in a typical power converter application can be in the range of 1 kHz to 100 kHz. The switching frequency $f_{SW}$ can be allowed to vary between a predetermined frequency range $f_{SW\_range}$, for example, between 1 kHz and 10 kHz, wherein the actual applied switching frequency $f_{SW}$ can be set by the controller.

Thus, the RLC-circuit resonant frequency $f_{res}$ of a power converter arrangement 10 can be approximately around 5-15, or 8-12, or substantially 10 times the switching frequency $f_{SW}$ of the semiconductor switch SW100 of the power converter arrangement 10.

Figure 2:
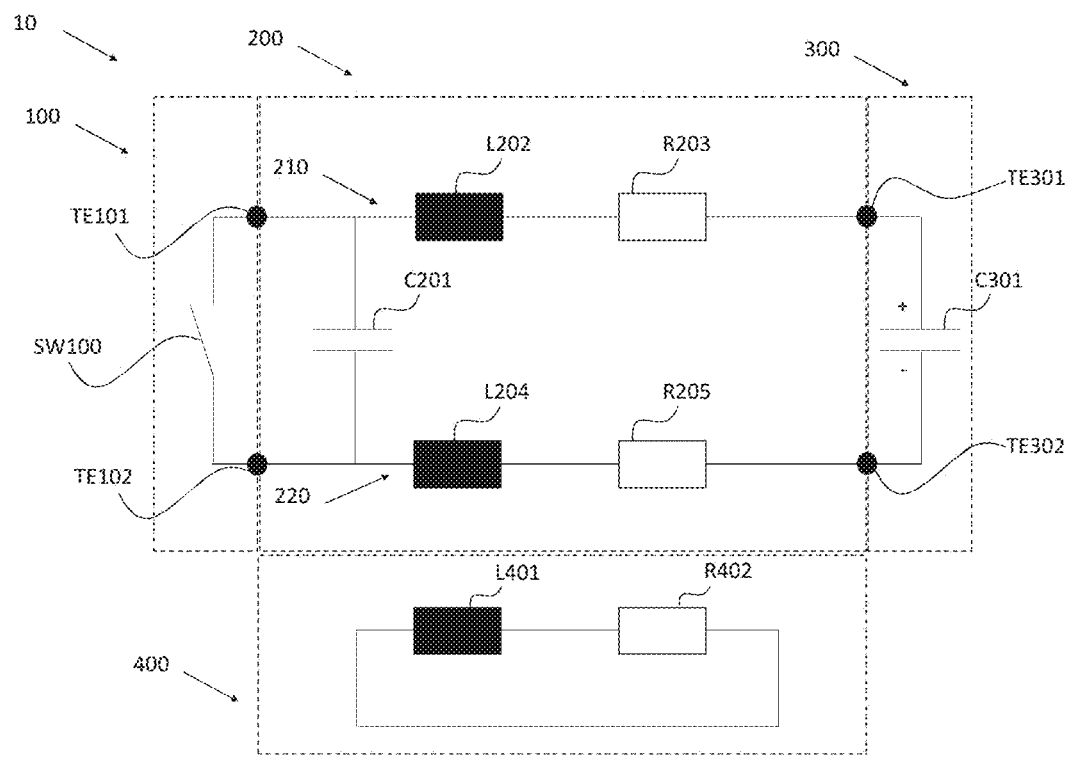
FIG. 2 shows a simplified electrical schematic of a power converter arrangement according to the invention.

FIG. 2 shows a simplified electrical equivalence circuit of an embodiment of the power converter arrangement 10 according to the invention.

The circuit shown in FIG. 2 is otherwise identical to circuit of FIG. 1, but with an addition of an attenuating element 400 magnetically coupled to at least one inductance L202, L204 of at least one conductor 210, 220 of the resonance circuit of the power converter arrangement 10. The power converter arrangement 10 comprises at least one attenuating element 400 for attenuating an electrical ringing in the resonant circuit.

The at least one attenuating element 400 is magnetically coupled to the at least one conductor 210, 220 such that variations in the electric current intensity of the at least one conductor 210, 220 induces eddy currents within the at least one attenuating element 400. The attenuating element 400 comprises inductance L401 and a resistance R402. The inductance L401 is created by a ferromagnetic material of the attenuating element 400, into which ferromagnetic material eddy currents are formed when the attenuating element 400 is coupled with a fluctuating magnetic field via an electromagnetic induction. The at least one attenuating element 400 is conductively isolated from the resonant circuit of the power converter arrangement 10.

Said fluctuating magnetic field is formed near the conductor 210, 220 inductances L202, L204. As the inductances L202, L204 are spread along the full length of the conductors 210, 220, thus in order to achieve effective coupling between the inductance L401 of the attenuating element and at least one of the inductances L202, L204 of the conductors 210, 220, the attenuating element 400 should also extend for a substantial length of the conductors 210, 220. As the conductors 210, 220 are typically sheet or flat type, in order to achieve effective coupling between the attenuating element 400 and the conductors 210, 220, the attenuating element 400 can also be made to sheet or flat form, the attenuating element 400 covering substantially at least one flat side of the conductors 210, 220. Very effective magnetic coupling is achieved between the attenuating element 400 and the at least one of the conductors 210, 220 by placing a sheet type attenuating element 400 on top of at least one of the sheet type conductors 210, 220, separated only by a sheet type insulator, for example a plastic sheet insulator. The at least one attenuating element (400) can have a form of a sheet, plate or a rod depending on the form of the conductors 210, 220.

According to an embodiment of the invention, the attenuating element 400 is formed as a coating on an insulator 410 of at least one of the conductors 210, 220. The at least one attenuating element 400 can comprise a ferromagnetic coating on a surface of the at least one insulator 410 of the at least one conductor 210, 220. Alternatively the attenuation element 400 can be formed between two layers of insulation sheets, thus forming a sandwich type arrangement having the ferromagnetic material in the between of the insulators. This latter approach makes it possible to arrange the attenuation element 400 between the opposite polarity conductors 210, 220 without forming conductive coupling between the attenuating element 400 and either of the conductors 210, 220. The at least one conductor 210, 220 can comprise of a first conductor 210, 220 and a second conductor 210, 220, and the at least one attenuating element 400 can be located between the first conductor 210, 220 and the second conductor 210, 220.

Resistance R402 represents the resistive nature of the attenuating element 400. Eddy currents are formed within the ferromagnetic material, and by Ohms law, the eddy currents cause power losses when flown via a resistance, thus dissipating the energy of the inductor L401. The ferromagnetic base material can be iron, for example which has a resistivity ρ value of $9.71 \times 10^{-8}$ Ω/m. Resistance R402 value can be modified higher by alloying the ferromagnetic base material (iron) with a material having higher resistivity value than iron, such as carbon ($\rho = 3-60 \times 10^{-5}$ Ωm) or manganese ($\rho = 1.44 \times 10^{-6}$ Ω/m). The ferromagnetic material is an alloy comprising iron as the base material of the alloy having a first resistive value and at least one additive element having a second resistive value, and the second resistive value being higher than the first resistive value. The at least one additive element can be carbon, manganese, or both.

The attenuating element 400 can also comprise a capacitive nature (not shown). The capacitive nature can help to create a secondary resonance current to the attenuating element 400 circuit. The capacitive nature can be, for example, achieved by layering the ferromagnetic materials and by isolating them from each other. Different layers can have different resistivity values in order to create suitable attenuation frequency response.

By modifying the values of the electrical quantities of the attenuating element 400, it is possible to tune such created circuit to respond to a particular magnetic flux frequency. By modifying the resistance R402 value to a higher value, the attenuating circuit will create more losses, and thus attenuate the induced current more effectively.

The modification of the attenuating element 400 electrical quantities can, for example, comprise of placing the element to predetermined distance from the conductors 210, 220, comprising the attenuating element 400 of an alloy material or comprising the attenuating element 400 of ferromagnetic layers having different resistivity values.

By coupling the attenuating element 400 magnetically to the resonance circuit of the power converter arrangement 10, it is possible to attenuate the resonance current of the resonance circuit more effectively than just by the resistances R203, R205 of the conductors 210, 220 of the resonant circuit. As the attenuating element 400 is not conductively coupled to the resonance circuit and can be tuned to respond to a predetermined resonance frequency $f_{res}$ or resonance frequency range $f_{res\_range}$, the attenuating element 400 does not interfere with the resonance circuit at the semiconductor switching frequency $f_{SW}$. The at least one attenuating element 400 is adapted to generate substantially more eddy currents at the at least one resonant frequency $f_{res}$ or at the at least one resonant frequency range $f_{res\_range}$ of the resonant circuit than at the at least one switching frequency $f_{SW}$ or at the at least one switching frequency range $f_{SW\_range}$ of the semiconductor switch system 100.

According to an embodiment of the invention, a snubber capacitor 450 (not shown) can be operatively conductively connected to the terminals TE101, TE102 of the semiconductor switch system 100. If the semiconductor switch system comprises plurality of semiconductor switches SW100, each of them can have a separate snubber capacitor 450 respectfully operationally conductively connected to the collector and emitter of each semiconductor switch SW100. The snubber capacitor 450 will hence be electrically parallel with the switch SW100 and the capacitor C201. The purpose of adding the snubber capacitor 450 is that it reduces the voltage stress at the terminals TE101, TE102 of the semiconductor switch system 100, thus preventing the damage of the semiconductor switch SW100 due to over voltage. Typically, in power converter arrangements 10, the parasitic capacitance C201 does not have high enough capacitance value to reduce the voltage spike caused by the energy stored to the inductance L202, L204 during opening (OFF-state) of the semiconductor switch SW100. For that reason a snubber capacitor 450 having substantially higher capacitance value than the capacitor C201 can be added to the resonant circuit.

Figure 3:
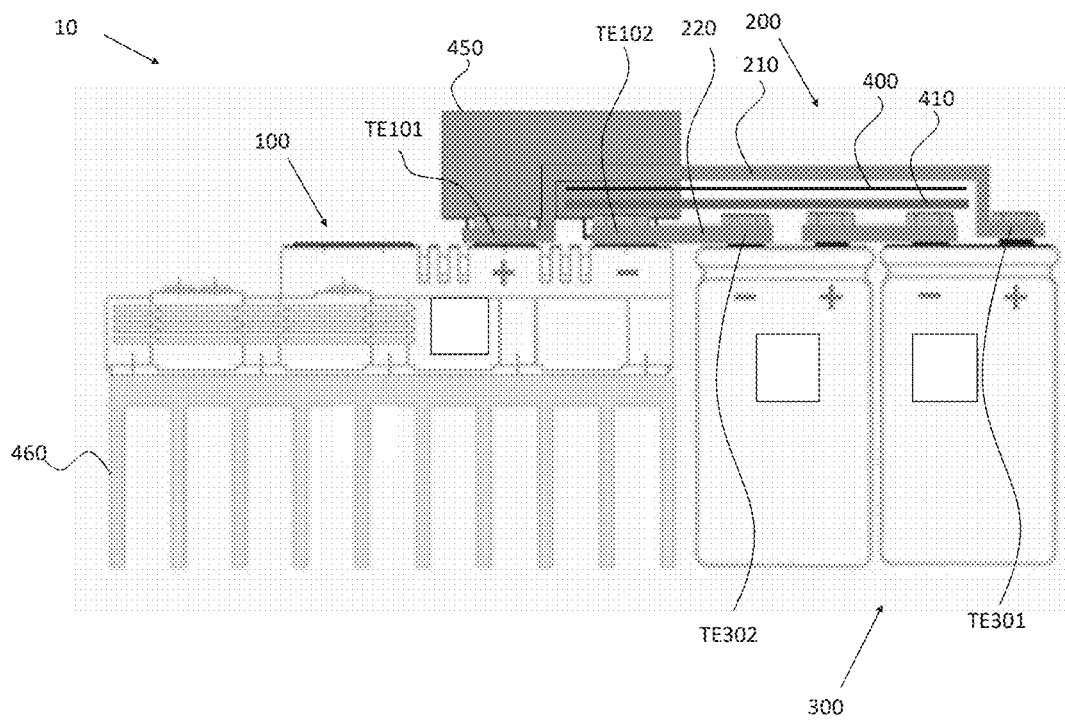
FIG. 3 shows an embodiment of a power converter arrangement according to the invention.

FIG. 3 illustrates an embodiment of a power converter arrangement 10 according to the invention.

In the FIG. 3, a semiconductor switch system 100 is arranged in thermal connection with a heat sink 460. Terminal TE101 of the semiconductor switch system 100 is electrically conductively connected to a terminal TE301 of the capacitor unit 300 via a conductor 210. Terminal TE102 of the semiconductor switch system 100 is electrically conductively connected to a terminal TE302 of the capacitor unit 300 via a conductor 220. The capacitor unit 300 comprises two series connected capacitors. A snubber capacitor 450 is operatively conductively connected to the terminals TE101 and TE102 of the semiconductor switch system 100. A plastic insulation sheet 410 is arranged between the opposite polarity conductors 210, 220 for electrically isolating the conductors 210, 220 from each other. A 0.1 mm thick ferromagnetic attenuating element 400 is arranged between the conductors 210, 220.

Electrical measurements were conducted to a similar arrangement as the one shown in FIG. 3, wherein resonance current was measured from the resonance circuit as shown in FIGS. 1 and 2. A switching frequency $f_{SW}$ of the semiconductor switch SW100 was set by a controller to some 110 kHz and the resonance current frequency $f_{res}$ was found to be some 1 MHz during the non-conductive (OFF) state of the semiconductor switch SW100.

When the attenuating element 400 was not applied to the power converter arrangement 10, the resonant current in the resonant circuit peaked at some 300A attenuating down to some 79A during some nine oscillations (~9 us) before the semiconductor switch SW100 was controlled again to conducting (ON) state.

When the attenuating element 400 was applied to the power converter arrangement 10, the resonant current in the resonant circuit peaked at some 170A attenuating down to some 10A during some nine oscillations (~9 us) before the semiconductor switch SW100 was controlled again to conducting (ON) state.

From these measurement results, the benefit of the attenuation element 400 becomes evidently clear, the resonance current peak level of the resonance circuit was reduced by nearly 50% and the oscillation current attenuated near to zero before switching the semiconductor switch SW100 again to conducting (ON) state.

It will be obvious to a person skilled in the art that the inventive concept can be implemented in various ways. The invention and its embodiments are not limited to the examples described above but may vary within the scope of the claims.

The invention claimed is:

1. A power converter arrangement comprising:
   a semiconductor switch system comprising at least one controllable switch;
   a capacitor unit comprising at least one capacitor having a capacitance value, the capacitor unit being operatively connected to the semiconductor switch system;
   a conductor arrangement comprising at least one conductor adapted to conduct an electric current between the capacitor unit and the semiconductor switch system, wherein the at least one conductor having a resistance and an inductance, and wherein a resonant circuit is formed by the resistance, the inductance and the capacitance,
   wherein the power converter arrangement comprises at least one attenuating element for attenuating an electrical ringing in the resonant circuit,
   wherein the at least one attenuating element is conductively isolated from the resonant circuit,
   wherein the at least one attenuating element comprises ferromagnetic material,
   wherein the at least one attenuating element is magnetically coupled to the at least one conductor such that variations in the electric current intensity of the at least one conductor induces eddy currents within the at least one attenuating element,
   wherein the semiconductor switch system has at least one switching frequency ($f_{sw}$) or at least one switching frequency range ($f_{sw\_range}$) and the resonant circuit has at least one resonant frequency ($f_{res}$) or at least one resonant frequency range ($f_{res\_range}$),
   wherein the at least one resonant frequency ($f_{res}$) or at least one resonant frequency range ($f_{res\_range}$) being different than the at least one switching frequency (fsw) or the at least one switching frequency range ($f_{sw\_range}$), and
   wherein the at least one attenuating element is adapted to generate more eddy currents at the at least one resonant frequency ($f_{res}$) or at the at least one resonant frequency range ($f_{res\_range}$) of the resonant circuit than at the at least one switching frequency ($f_{sw}$) or at the at least one switching frequency range ($f_{sw\_range}$) of the semiconductor switch system.

2. The power converter arrangement according to claim 1, wherein the ferromagnetic material is an alloy comprising a base material of the alloy having a first resistive value and at least one additive element having a second resistive value, and the second resistive value being higher than the first resistive value.

3. The power converter arrangement according to claim 2, wherein the base material for the alloy comprises iron and the at least one additive element comprises carbon and/or manganese.

4. The power converter arrangement according to claim 3, wherein the at least one conductor comprises a first conductor and a second conductor, and the at least one attenuating element is located between the first conductor and the second conductor.

5. The power converter arrangement according to claim 2, wherein the at least one attenuating element comprises a ferromagnetic coating on a surface of at least one insulator of the at least one conductor.

6. The power converter arrangement according to claim 2, wherein the at least one attenuating element has a form of a sheet, plate or a rod.

7. The power converter arrangement according to claim 2, wherein the resonant circuit of the power converter arrangement further comprises a snubber capacitor operatively connected to the terminals of the semiconductor switch system.

8. The power converter arrangement according to claim 1, wherein the at least one conductor comprises a first conductor and a second conductor, and the at least one attenuating element is located between the first conductor and the second conductor.

9. The power converter arrangement according to claim 1, wherein the at least one attenuating element comprises a ferromagnetic coating on a surface of at least one insulator of the at least one conductor.

10. The power converter arrangement according claim 1, wherein the at least one attenuating element has a form of a sheet, plate or a rod.

11. The power converter arrangement according to claim 1, wherein the resonant circuit of the power converter arrangement further comprises a snubber capacitor operatively connected to terminals of the semiconductor switch system.

12. The power converter arrangement according to claim 1, wherein the capacitor unit is part of a DC-link of the power converter.

13. The power converter arrangement according to claim 1, wherein the power converter arrangement is part of a frequency converter, inverter or a DC-DC chopper.

* * * * *